(12) United States Patent
Khare et al.

(10) Patent No.: US 10,856,073 B2
(45) Date of Patent: Dec. 1, 2020

(54) SWITCH ARRANGEMENTS

(71) Applicant: Cirrus Logic International Semiconductor Ltd., Edinburgh (GB)

(72) Inventors: Rupesh Khare, Edinburgh (GB); Simon Foster, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/708,854

(22) Filed: Dec. 10, 2019

(65) Prior Publication Data

US 2020/0186918 A1   Jun. 11, 2020

Related U.S. Application Data

(60) Provisional application No. 62/777,961, filed on Dec. 11, 2018.

(30) Foreign Application Priority Data

Jan. 18, 2019   (GB) .................................. 1900763.2

(51) Int. Cl.
*H03G 3/00* (2006.01)
*H04R 3/00* (2006.01)
(Continued)

(52) U.S. Cl.
CPC ............... *H04R 3/00* (2013.01); *H03F 3/185* (2013.01); *H03G 3/00* (2013.01); *H04R 5/04* (2013.01); *H03F 2200/03* (2013.01)

(58) Field of Classification Search
CPC .. H04R 5/04; H04R 3/00; H03F 3/185; H03G 3/00
See application file for complete search history.

(56) References Cited

U.S. PATENT DOCUMENTS 9,294,598 B2   3/2016   Yamada et al.
10,097,178 B1   10/2018   Ou et al.
(Continued)

FOREIGN PATENT DOCUMENTS

EP   2448120 A1   5/2012
GB   2547730 B2   7/2016

OTHER PUBLICATIONS

Combined Search and Examination Report under Sections 17 and 18(3), UKIPO, Application No. GB1900763.2, dated Jul. 4, 2019.

*Primary Examiner* — Simon King
(74) *Attorney, Agent, or Firm* — Jackson Walker L.L.P.

(57) ABSTRACT

This application relates to switch arrangements, in particular switch arrangements suitable for switchable connecting nodes of audio driving circuitry (100) that may, in use, experience a signal swing depending on an output audio driving signal ($V_D$). A switch arrangement (300) comprises first and second transistors (301 and 302) of the same polarity type connected in series between the first and second nodes, with a third transistor (303) connected between a defined voltage ($V_S$) and an intermediate node (N3) between the first and second transistors. The first transistor (301) has a drain connection to the first node (N1) and a source connection to the intermediate node (N3). The second transistor (302) has a drain connection to the second node (N2) and a source connection to the intermediate node (N3). The third transistor (303) has a source connection to the defined voltage ($V_S$) and a drain connection to the intermediate node (N3) and regulates the voltage at the intermediate node when the switch arrangement is in an off state.

18 Claims, 4 Drawing Sheets

(51) Int. Cl.
   *H03F 3/185*   (2006.01)
   *H04R 5/04*   (2006.01)

(56) References Cited

U.S. PATENT DOCUMENTS

| | | |
|---|---|---|
| 10,171,072 B2 | 1/2019 | Ko et al. |
| 2008/0116751 A1* | 5/2008 | Kihara ............... H03K 17/6874 307/113 |
| 2012/0056660 A1* | 3/2012 | Yamada ............. H03K 17/6874 327/434 |
| 2016/0191036 A1 | 6/2016 | Ko et al. |
| 2017/0104481 A1* | 4/2017 | Ko ......................... A61B 8/469 |
| 2017/0251294 A1 | 8/2017 | Khare |

* cited by examiner

SWITCH ARRANGEMENTS

FIELD OF DISCLOSURE

The field of representative embodiments of this disclosure relates to methods, apparatus and/or implementations concerning or relating to switch arrangements and, in particular, to switch arrangements for use in audio driving circuitry, for example for controlling at least one parameter of operation of an audio output chain.

BACKGROUND

Many electronic devices have the ability to provide audio driving signals to audio output transducers, e.g. loudspeakers. In some cases the electronic device may be capable of providing audio driving signals to an accessory or peripheral apparatus, for example a set of headphones or earbuds or the like, that may, in use, be removably connected to the electronic device via some wired connection. For example many electronic devices may have a receptacle or socket, such as a 3.5 mm jack-socket for example, for receiving a corresponding mating plug of an accessory apparatus. Audio driving circuitry, for example an audio codec, of the electronic device may be operable to provide analogue audio driving signals to drive loudspeakers of the accessory apparatus when connected.

There is a wide variety of different audio accessory apparatus that may, in use, be connected to such an electronic device and at least some audio accessory apparatus may represent a relatively high impedance load. For example, some headphone accessories may have a load impedance, for DC, of the order of several hundred ohms.

To drive audio accessories that present a high impedance load, it may be desirable for the audio driving circuitry to be able to generate relatively high power, large amplitude driving signals. In particular, it may be desirable to generate driving signals of a greater amplitude than would conventionally be the case for such audio driving circuitry, e.g. codecs or headphone amplifier circuits or the like. Such large amplitude driving signals can, however, result in greater than usual voltage stresses across components of the audio driving circuitry, for instance switches for controlling various aspects of the operation of the audio driving circuitry.

SUMMARY

Embodiments of the present disclosure relate to methods, apparatus and systems for switching and in particular to the implementation and use of switch arrangements that are suitable for audio driving circuitry.

According to an aspect of the disclosure there is provided audio driving circuitry comprising:
at least one switch arrangement, the or each switch arrangement being connected between respective first and second nodes of the audio driving circuitry for switchably connecting the first and second nodes and comprising:
first and second transistors of the same polarity type connected in series between the first and second nodes; and
a third transistor connected between a defined voltage and an intermediate node between the first and second transistors; wherein:
the first transistor has a drain connection to the first node and a source connection to the intermediate node;
the second transistor has a drain connection to the second node and a source connection to the intermediate node; and
the third transistor has a source connection to the defined voltage and a drain connection to the intermediate node.

In some implementations, for at least one switch arrangement, at least one of the first, second and third transistors comprises a laterally diffused MOS transistor and/or at least one of the first, second and third transistors comprises an extended drain MOS transistor.

For at least one switch arrangement the first, second and third transistors may each comprises n-type transistors. In such a case the defined voltage may be at least as negative as an expected most negative signal value at the first node.

In some embodiments however, for at least one switch arrangement, the first, second and third transistors may each comprises p-type transistors.

In some implementations, a gate voltage tolerance for at least one of the first transistor and the second transistor may be lower than an expected peak-to-peak voltage swing at said first node in use. Additionally or alternatively a gate voltage tolerance for at least one of the first transistor and the second transistor may be lower than an expected maximum voltage difference between the first and second nodes in use.

The switch arrangement may comprise a switch controller configured to control said switch arrangement in one of: an enabled state with the first and second transistors turned-on and the third transistor turned off; and a disabled state with the first and second transistors turned-off and the third transistor turned on. In some implementations the switch controller may be configured to turn the first and second transistors off before turning the third transistor on when transitioning from the enabled state to the disabled state. Additionally or alternatively the switch controller may be configured to turn the third transistor off before turning the first and second transistors when transitioning from the disabled state to the enabled state.

The audio driving circuitry may include an output driver for outputting an audio driving signal to an output path. In which case, in some embodiments, the switch arrangement or one of the switch arrangements, may be configured as a clamp switch, with the respective first node coupled to the audio output path for the audio driving signal and the respective second node coupled to a defined reference voltage.

In some embodiments, at least one switch arrangements may be configured as a gain switch for varying a gain of the output driver. For a switch arrangement configured as a gain switch, the respective first node may be coupled to a resistor network and the respective second node may be coupled to an input path for the output driver.

The audio driving circuitry may be implemented as an integrated circuit. The audio driving circuitry may form at least part of an audio codec.

Embodiments also relate to an electronic device comprising audio driving circuitry according to any of the variants described herein and a connector for making a removable mating connection with an accessory apparatus in use, wherein the audio driving circuitry is configured to output at least one audio driving signal to an electrical contact of said connector.

The electronic device may be at least one of: a portable device, a battery powered device, a communication device; a mobile or cellular telephone device or a smartphone; a computing device; a tablet, notebook, laptop or desktop computer; a wearable device; a smartwatch; a voice activated or voice controlled device.

In another aspect there is provided audio driving circuitry comprising:
- a switch arrangement connected between first and second nodes of the audio driving circuitry for switchably connecting the first and second nodes and comprising:
  - a first transistor with a drain connection to the first node and a source connection to an intermediate node;
  - a second transistor with a drain connection to the second node and a source connection the intermediate node;
  - a third transistor with a source connection to a defined voltage and a drain connection to the intermediate node;
  - wherein at least one of the first and second transistors has a gate voltage tolerance which is lower than an expected voltage swing at the first node.

In another aspect there is provided audio driving circuitry comprising:
- a switch arrangement comprising first and second transistors in series between first and second switch nodes, the switch arrangement being configured to operate in:
  - an enabled mode with both the first and second transistors turned on by a first gate voltage; and
  - a disabled mode with both the first and second transistors turned off by a second gate voltage;
  - wherein in the disabled mode an intermediate voltage at a connection between the first and second transistors is controlled to a defined voltage level.

Unless expressly indicated to the contrary, any of the various features of the various implementations discussed herein may be implemented together with any one or more of the other described features in any and all suitable combinations.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

As discussed above, a host device may include audio driver circuitry, such as an audio codec or the like, for outputting audio driving signals to audio transducers. The audio driver circuit may be capable of outputting audio drive signals to an accessory apparatus that, in use, is removably connected to the host device, and the audio driver circuitry may thus comprise a headphone amplifier circuit, for instance as at least part of an audio codec.

Figure 1:
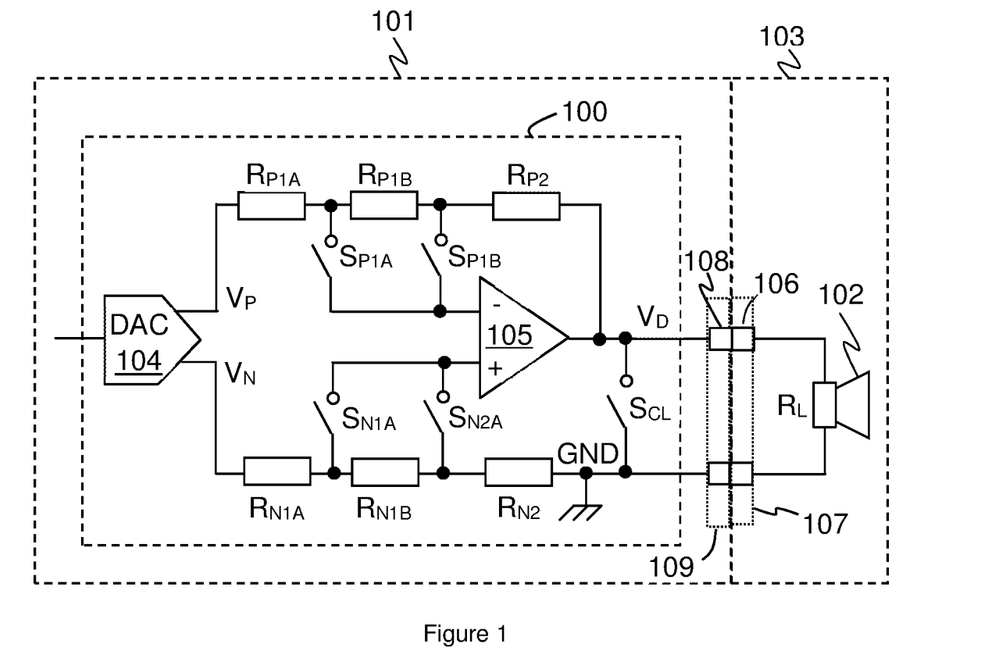
FIG. 1 illustrates one example of audio driving circuitry.

FIG. 1 illustrates one simplified example of some audio driving circuitry 100. FIG. 1 illustrates that the audio driving circuitry 100 may be part of a host device 101 and arranged to output, in use, an audio driving signal $V_D$ to drive an audio load 102, e.g. loudspeaker, of an accessory apparatus 103. Note that FIG. 1 shows just one audio output for simplicity but in practice there may be additional audio signals paths, for instance Left and Right audio channels for driving stereo audio output signals to Left and Right loudspeakers of a connected accessory apparatus.

In the example of FIG. 1, the audio signal path includes a DAC (digital-to-analogue converter) 104 and an output driver 105, such as a suitable amplifier. In this example the DAC 104 generates a differential output signal and thus generates first and second analogue outputs $V_P$ and $V_N$ as part of a differential pair. The output driver 105, in this example, is thus a differential-input amplifier that generates the driving signal $V_D$. The output driver 105 receives, in use, suitable supply voltages (not illustrated), for instance suitable bipolar supply voltages, and generates the output driving signal $V_D$ to vary positively and negatively with respect to a defined reference voltage, in this example ground (GND). It will be noted that whilst FIG. 1 shows a differential-output DAC 104 and differential-input amplifier 105, it will be understood that single-ended audio signal paths may be implemented in some audio driving circuitry.

The driving signal $V_D$ generated by the driver 105 is output, in this case, to drive a loudspeaker 102 of accessory apparatus 103, e.g. headphone or earbud speakers or the like. In use, the accessory apparatus 103 may be removably connected to the host device via suitable connectors, such as a jack plug of the accessory apparatus and a jack socket of the host device, but any suitable plug and receptacle connectors may be used, and in some instances there may be at least one intermediate apparatus (not shown in FIG. 1) between the host device 101 and the audio accessory 103 being driven. In use, contacts 106 of the audio accessory apparatus 103, for example poles of a jack plug (generically indicated by dotted box 107) will be coupled, directly or indirectly, to respective contacts 108 of the host device 101, for example poles of a jack socket (generically indicated by dotted box 109). The loudspeaker 102 of the audio accessory apparatus 103 may also have a return path to a defined reference voltage, in this example to ground, via one contact/pole 106 of the connector 107 of the accessory apparatus.

FIG. 1 also illustrates that audio driving circuitry 100 may comprise switches for controlling operation of the audio driving circuitry 100.

For example, FIG. 1 illustrates an implementation with a variable gain provided by resistances $R_{P1A}$, $R_{P1B}$, $R_{P2}$ and switches $S_{P1A}$ and $S_{P1B}$ for one of the differential paths, and corresponding resistances $R_{N1A}$, $R_{N1B}$, $R_{N2}$ and switches $S_{N1A}$ and $S_{N1B}$ for the corresponding differential path. As will be understood by one skilled in the art, the output $V_P$ from the DAC 104 may be coupled to the relevant input of the amplifier 105 by selectively closing one of the switches $S_{P1A}$ or $S_{P1B}$ so as to select the point at which the amplifier input is tapped from the resistor network formed by $R_{P1A}$, $R_{P1B}$ and $R_{P2}$, and control an analogue gain. The corresponding switch $S_{N1A}$ or $S_{N1B}$, will also be closed to provide substantially the same gain for the output $V_N$ from the DAC 104.

In some instances the switches $S_{P1A}$, $S_{P1B}$, $S_{N1A}$ and $S_{N1B}$, which may be collectively referred to herein as gain switches, may be controlled so as to control the analogue gain applied in correspondence with some upstream digital gain applied in the digital domain prior to DAC 104, for instance to implement DRE (Dynamic Range Extension) techniques as would be understood by one skilled in the art. FIG. 1 illustrates two pairs of gain switches, i.e. a first pair $S_{P1A}/S_{N1A}$ and second pair $S_{P2A}/S_{N2A}$, but it will be understood that more switch pairs could be provided, with more corresponding resistances as part of the resistor network, so as to allow for more step changes in gain.

FIG. 1 also illustrates that there may be a clamp switch $S_{CL}$ for clamping the output of the amplifier 105 to ground, e.g. when not outputting the driving signal $V_D$.

Figure 2A:
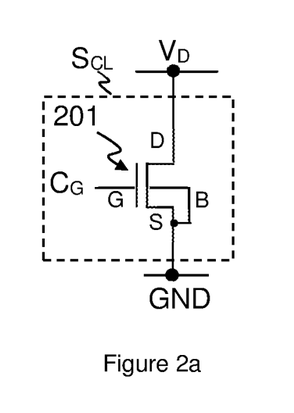
FIGS. 2a and 2b illustrate examples of conventional switch arrangements comprising a single transistor or a transmission gate respectively.
Figure 2B:
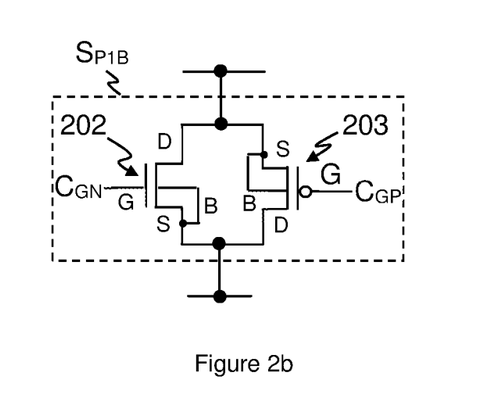

Conventionally the clamp switch $S_{CL}$ may be implemented by a suitably rated transistor, for instance an NMOS device, for example as illustrated in FIG. 2a. FIG. 2 shows that the clamp switch $S_{CL}$ could conventionally be implemented by a NMOS transistor 201 with its drain terminal coupled to the output path, i.e. the path for the driving signal $V_D$, and its source terminal (and bulk terminal) coupled to ground (GND). The gate terminal is driven to suitable voltages by a gate control signal $C_G$ so as to control conduction through the transistor so as to control the switch to be on (closed) or off (open). Each of the gain switches $S_{P1A}$, $S_{P1B}$, $S_{N1A}$ and $S_{N1B}$ may likewise be implemented by a suitable rated MOS transistor, or MOS transmission gate as illustrated in FIG. 2b. FIG. 2b illustrates a conventional transmission gate with an NMOS 202 and PMOS 203 coupled in parallel and controlled by complementary gate control signals so that the NMOS 202 and PMOS 203 are both off (or open) when the switch is disabled so as to block conduction or both on (closed) in an enabled state to allow for bidirectional conduction.

The NMOS transistor 201 illustrated in FIG. 2a and the NMOS and PMOS transistors 202 and 203 illustrated in FIG. 2b should have a voltage rating suitable for the maximum expected voltage stress in use. For the clamp switch $S_{CL}$ and at least some of the gain switches, the maximum expected voltage will depend on the output voltage range of the output driver 105.

As noted, the clamp switch $S_{CL}$ is coupled between the output path for the driving signal $V_D$ and ground. In use, when the audio circuit is operable and the output driver 105 is producing the audio driving signal $V_D$, the clamp switch $S_{CL}$ will be turned-off (i.e. open) and non-conducting. As illustrated in FIG. 2a, the voltage at the drain terminal of the NMOS 201 will thus vary with the driving signal $V_D$ whilst the source terminal is held at ground, and the gate voltage will be driven by the gate control $C_G$ to a value to maintain the switch in an off state, i.e. to keep the gate-source voltage below the relevant threshold.

The maximum drain-source voltage (and drain-gate voltage) will thus depend on the maximum magnitude of the driving signal $V_D$.

Likewise, one side of gain switch $S_{P1B}$ is coupled to the output of the amplifier 105 via resistance $R_{P2}$ and thus may, in use, experience a voltage range which is at or near to substantially the full voltage range of the driving signal $V_D$. If, in use, this switch $S_{P1B}$ is off (or open) and gain switch $S_{P1A}$ is turned-on (or closed) and conductive, then the other side of switch $S_{P1B}$ is coupled to the input to the amplifier 105, and thus this side of the switch will also experience a voltage swing, based on the output voltage $V_P$ of the DAC 104. The output voltage range of $V_P$ will typically be significantly less than that of the driving signal $V_D$ and the voltage across the gain switch $S_{P1B}$ thus will also depend on the voltage of the driving signal $V_D$.

Conventionally, with semiconductor fabrication processes that have been used to fabricate audio driving circuitry such as headphone amplifier circuits, transistors with suitable voltage ratings for the conventional driving levels for the audio driving circuitry may be readily implemented. Purely by way of example, a conventional audio driving circuit may have been implemented to operate with driving signals $V_D$ at a level of about one volt rms (1 Vrms) or so and thus a peak-to-peak voltage range of the order two to three volts or so, for example a voltage range of +1.5V to −1.5V. Transistors able to cope with such voltage stress, say of the order of 3.3V, may be readily implemented and mass produced, at least for some common semiconductor process node geometries.

As noted above however it may, in some instances, be desirable to be able to output larger amplitude driving signals, for example to provide good user experience when driving audio accessories such as headphones that present a relatively high impedance load, say of the order of several hundred ohms. Again, purely by way of example, it may in some instances be desirable to output driving signals of the order of a few volts rms, which may involve peak-to-peak voltage swings of the order of nearly ten volts or so, e.g. a swing from say +5V to −5V.

Referring back to FIG. 2a, if the voltage range of the audio driving signal $V_D$ were at such a level, e.g. from +5V to −5V then, as noted above, the source-voltage could, in use when the clamp switch $S_{CL}$ is off, rise to a magnitude of 5V. In addition, to ensure that NMOS transistor 201 remains off for all values of the driving signal $V_D$ it may be necessary to drive the gate voltage of the NMOS transistor to a negative voltage of the same or greater magnitude than the peak negative value of the driving signal $V_D$, e.g. to a voltage of −5V or so in the example discussed. This may lead to a voltage stress greater than the voltage rating of some conventional transistor devices.

Embodiments of the present disclosure relate to switch arrangements, and in particular to switch arrangements for audio driving circuitry.

Figure 3A:
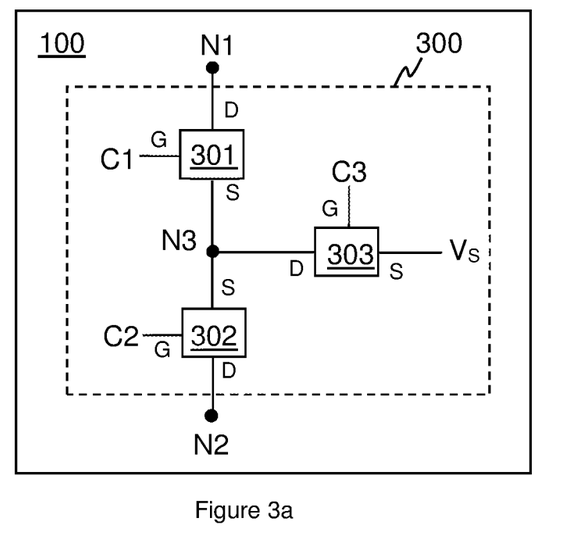
FIG. 3a illustrates a switch arrangement according to an embodiment.
Figure 3B:
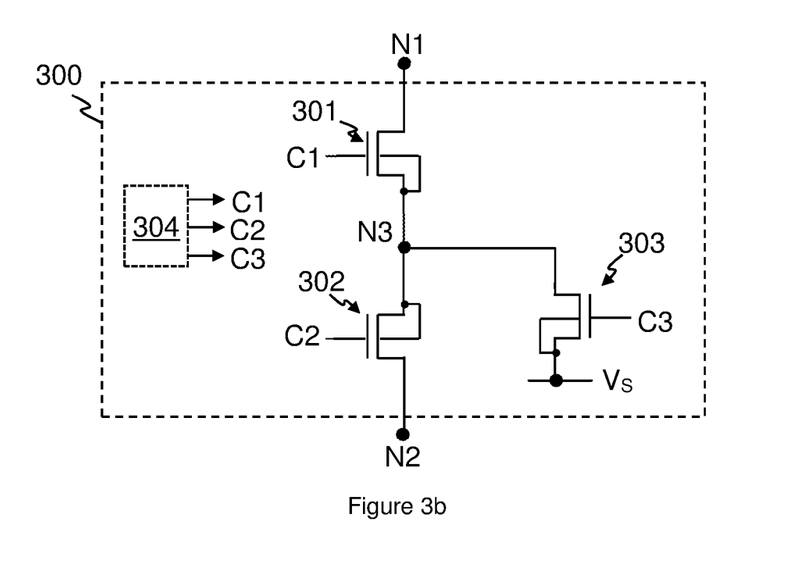
FIG. 3b shows an embodiment of the switch arrangement in more detail.

FIG. 3a illustrates one example of a switch arrangement 300 for providing a switch connection between two nodes N1 and N2 of an audio driving circuit 100. The switch arrangement comprises a first transistor 301 in series with a second transistor 302 between the nodes N1 and N2. The first and second transistors are of the same polarity type, i.e. both n-type (n-channel) or both p-type (p-channel). FIG. 3b illustrates one example of the switch arrangement 300 in more detail and illustrates that the first and second transistors 301 and 302 in this example are both NMOS devices. The drain terminal of the first transistor 301 is coupled to the first node N1 and the source terminal of the first transistor 301 is coupled to an intermediate node N3 of the series connection. The drain terminal of the second transistor 302 is coupled to the second node N2 and the source terminal of the second transistor 302 is also coupled to the intermediate node N3 of the series connection. The source terminals of the first and second transistors 301 and 302 are therefore connected together via the intermediate node N3. In some implementations the bulk or body terminal of the first transistor may be coupled to its source terminal, i.e. the bulk of the first transistor 301 may also be coupled to the intermediate node N3. Likewise the bulk or body terminal of the second transistor 302 may also be coupled to its source terminal and thus also coupled to the intermediate node N3.

The gate terminals of the first and second transistors 301 and 302 are controlled by respective gate control signals C1 and C2. In practice the gate control signals C1 and C2 may, in at least some embodiments, be the same as each other and may controllably vary between two different voltages to control the first and second transistors to both conduct in an on-state for the switch arrangement 300 and both be non-conductive in an off-state the switch arrangement 300.

The switch arrangement also comprises a third transistor 303, which may be of the same polarity type (i.e. n-type or p-type) as the first and second transistors. The third transistor 303 is coupled between the intermediate node N3, i.e. the node coupled to the source terminals of the first and second transistors 301 and 302, and a defined voltage $V_S$. The source connection of the third transistor 303 may be coupled to the defined voltage $V_S$ and the drain connection of the third transistor 303 may be coupled to the intermediate node N3. The bulk or body terminal of the third transistor 303 may be coupled to its source terminal, and thus connected to the defined voltage $V_S$.

The defined voltage $V_S$ may conveniently be a supply voltage, i.e. a supply voltage for the amplifier 105. For the example illustrated in FIG. 3b using NMOS devices as the first, second and third transistors 301, 302 and 303, the voltage $V_S$ may be a voltage which is at least as negative (with respect to the defined reference voltage, e.g. GND) as the most negative expected value of the audio driving signal $V_D$. The third transistor 303 is controlled by a gate control signal C3 to regulate the voltage at the intermediate node N3 when the switch arrangement 300 is in the off state. In some examples there may be a switch controller 304 to generate the gate control signals C1, C2 and C3 (although these signals may be generated by other parts of the audio driving circuitry).

The first, second and third transistors 301, 302 and 303 may comprise Laterally Diffused MOS devices (LDMOS) or Extended Drain MOS devices (EDMOS). LDMOS and EDMOS are known designs, that have been used in the field of power amplifiers for RF communications. Such devices are designed to be able to withstand drain-source voltages that may be greater than other standard designs. For instance LDMOS devices with a voltage rating of 5V or 12V can be implemented in conventional semiconductor fabrication processes which is advantageous for mass production. However whilst implementing a transistor as an LDMOS or EDMOS may improve the voltage handling capability of the drain, e.g. from say 3.3V of a standard design to 5V or 12V, the gate oxide may effectively be the same as the standard device, and thus there is still a limit to the voltage tolerance of the gate, and in particular a limit to the maximum gate-source voltage that can safely be tolerated.

An LDMOS/EDMOS with a limited voltage tolerance for its gate-source voltage may thus not be suitable, on its own, to provide the switches discussed previously. For instance, referring back to FIG. 2, if the NMOS 201, arranged as a clamp switch $S_{CL}$, were implemented as a 12V LDMOS, then in the example described above where the driving signal may vary from +5V to −5V, the drain-source voltage across the device would remain within tolerance. However, if the maximum gate-source voltage that could be tolerated were of the order of 3V, then in use if the gate of the NMOS 201 were driven to near −5V to turn it off and the driving signal were to be positive, the gate-source voltage would be significantly greater than could be tolerated.

The switch arrangement 300 illustrated in FIGS. 3a and 3b ensures that whilst the voltage difference between the nodes N1 and N2 may be relatively high, and in particular may be greater than a voltage tolerance for the gate of the transistors of the switch arrangement, in use the gate-source voltages of all the transistors can be maintained at relatively low levels and within acceptable limits.

When the switch arrangement 300 is enabled, i.e. in an on state, both the first and second transistors 301 and 302 will be turned on and conducting. The voltage at the intermediate node N3 will thus depend on the voltage at nodes N1/N2. For all the switch locations described above however the expected voltages at the respective nodes N1/N2 when the relevant switch is on are relatively low. Thus if the gate control signals C1 and C2 are driven to a suitable positive voltage to turn-on the first and second transistors 301 and 302, the gate-source voltages of each of these transistors will remain below an acceptable limit. In the on-state for the switch arrangement the third transistor 303 may be off and thus the control signal C3 may be pulled to the same level as $V_S$ and thus there is no gate-source voltage stress on the third transistor.

When the switch arrangement 300 is disabled or in an off state, the first and second transistors 301 and 302 are turned-off, for instance by the control voltages C1 and C2 pulling the respective gate voltages to $V_S$. In this state the third transistor 303 is turned-on, so that the intermediate node N3 is regulated to voltage substantially equal to $V_S$, thus preventing any significant gate-source voltage stress on the first and second transistors 301 and 302. The third transistor 303 may be turned on by control signal C3 rising to a voltage that is more positive than $V_S$ by the relevant threshold voltage, whilst keeping the gate-source voltage within acceptable limits.

Figure 4A:
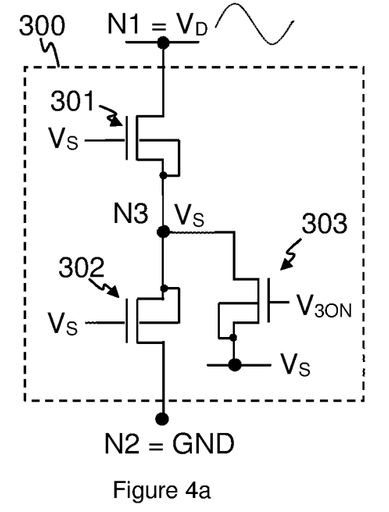
FIGS. 4a and 4b illustrate the use of the switch arrangement of FIG. 3 as a clamp switch.
Figure 4B:
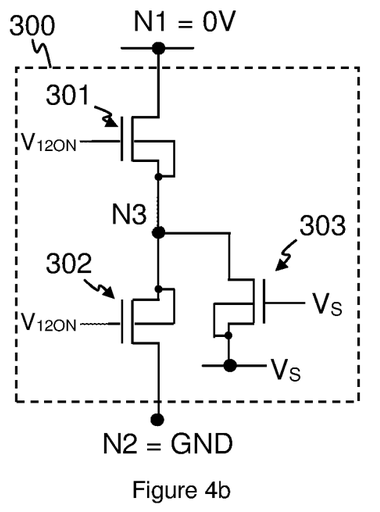

The switch arrangement 300 may be implemented for the clamp switch $S_{CL}$, as illustrated in FIGS. 4a and 4b. The first node N1 may thus be coupled to the audio output path for the driving signal $V_D$ and the second node N2 may be coupled to ground (GND).

FIG. 4a illustrates the switch arrangement 300, used as the clamp switch $S_{CL}$ in the off state, i.e. without the clamp enabled. In this state the audio driving circuitry 100 may be operating to generate the audio driving signal $V_D$ and thus the voltage at the node N1 may vary with the driving signal $V_D$. The first and second transistors 301 and 302 are turned off, e.g. by the controller 304, by driving the gate voltages to voltage $V_S$. The third transistor 303 is turned on, by a suitable gate voltage $V_{3ON}$ so as to couple the intermediate node N3 to the defined voltage $V_S$. This results in no significant gate-source voltage for either of the first or second transistors 301 or 302 and ensures that the switch arrangement 300 remains off for any value of the audio driving signal $V_D$.

Purely as an example, consider that the audio driving signal $V_D$ may vary within the range of about +5V to −5V and that a supply voltage of −5V is available, e.g. as a supply for output driver 105, and is used as the voltage $V_S$. Thus, in the off-state illustrated in FIG. 4a, the gates of the first and second transistors 301 and 302 may each be driven to a voltage of −5V and the third transistor 303 will be turned-on so as to regulate the intermediate node N3 to a voltage of substantially −5V.

The maximum voltage across the first transistor 301 will occur if the driving signal $V_D$ is at its maximum positive value, say +5V. This would result in a drain-source voltage for the first transistor of 10V or so. This is within the tolerance of a 12V LDMOS/EDMOS device. The gate-source voltage of the first transistor 301 is substantially zero. The voltage across the second transistor 302, and thus its drain-source voltage, is equal to the difference between $V_S$ and ground, i.e. about 5V in this example. This is within the tolerance of a 12V or possibly a 5V LDMOS/EDMOS device. Again the gate-source voltage of the second transistor 302 is substantially zero.

The drain-source voltage for the third transistor 303 is also substantially zero. To turn the third transistor on, the voltage $V_{3ON}$ may be sufficiently more positive than $V_S$, say of the order of −2V in this example, so that the gate-source voltage for the third transistor may be of the order of 3V. Existing semiconductor processes used for audio driving circuitry may readily provide transistors with a gate oxide with a voltage tolerance of the order of 3V.

FIG. 4b illustrates the switch arrangement 300 used as the clamp switch $S_{CL}$ in the on state, i.e. with the clamp enabled. In this state the audio driving circuitry 100 will not be operating to generate any significant audio driving signal $V_D$ and thus the voltage at the node N1 may be expected to be substantially zero. The first and second transistors 301 and 302 are turned on by driving the gate voltages to a voltage $V_{12ON}$. The third transistor 303 is turned off, by a gate voltage equal to $V_S$.

In this state the voltage at the intermediate node N3 will be substantially zero and there will be no significant drain-source voltage across either of the first or second transistors 301 and 302. The gate voltage $V_{12ON}$ for the first and second transistors 301 and 302 may be any suitable positive voltage, say around +2.5V, and thus the gate-source voltage for both of these devices may be of the order of +2.5V and within an acceptable tolerance.

The voltage across the third transistor 303, i.e. its drain-source voltage is of the order of 5V, which is within the tolerance of a 12V or possibly a 5V LDMOS/EDMOS device. In this example there is no significant gate-source voltage for the third transistor 303 in this state.

The switch arrangement 300 may additionally or alternatively be implemented for one or more of the gain switches, in particular the gain switches that may, in use, see a large swing due to the driving signal $V_D$.

As noted above, in use, a selected one of the plurality of gain switches will be closed to form part of the signal path between the DAC 104 and output driver 105 and to tap the signal from a particular tap point of the resistor network so as to implement a desired gain. For whichever gain switch is on (or enabled), there will be a limited voltage difference between the nodes N1 and N2 and the voltages at these nodes will vary with the input signal for the amplifier. However for the other gain switches, which will be in the off state, there may be a voltage difference across the gain switch and for any gain switches which are coupled to tap points of the resistor network downstream of the selected tap point, the voltage at one of the nodes of the switch arrangement could experience a relatively large voltage swing.

Figure 5A:
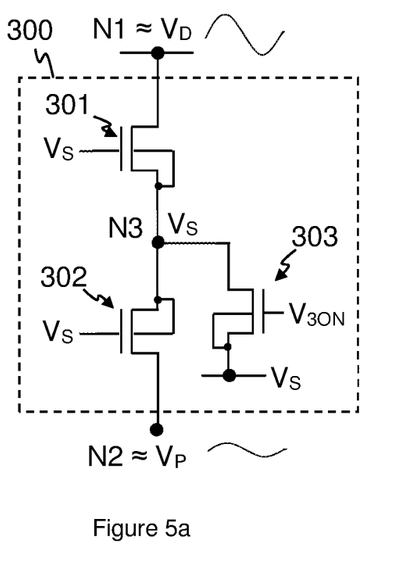
FIGS. 5a and 5b illustrate the use of the switch arrangement of FIG. 3 as a gain switch.
Figure 5B:
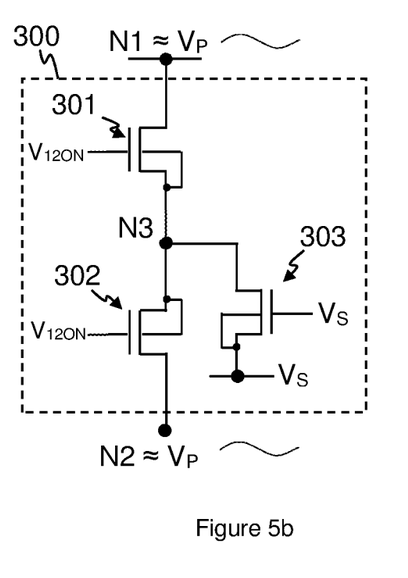

FIGS. 5a and 5b illustrate the switch arrangement 300 implemented as gain switch $S_{P1B}$ as an example. The first node N1 may thus be coupled to a tap point from the resistor network provided by $R_{P1A}$, $R_{P1B}$ and $R_{P2}$ and the second node N2 may be coupled to an input of the output driver 105.

FIG. 5a illustrates the switch arrangement 300 when the gain switch $S_{P1B}$ in the off state. In this state, another gain switch (in the example of FIG. 1, the other gain switch $S_{P1A}$) will be in the on-state so as to provide an input to the amplifier from another tap point of the resistor network. When gain switch $S_{P1B}$ is in this off-state the voltage at node N1 could vary within a relatively large voltage range depending on the output driving signal $V_D$. For instance, based on the example discussed above where the driving signal $V_D$ may vary within the range +5V to −5V, the voltage at node N1 when the gain switch $S_{P1B}$ is in the off-state could vary within substantially all, or at least a significant proportion, of this voltage range. The actual voltage range will depend on the implementation of the audio circuitry and the resistor network and the position of the relevant gain switch in the resistor network, as will be appreciated by one skilled in the art.

In the off-state, as illustrated in FIG. 5a, the third transistor 303 may be turned-on to regulate the voltage at node N3 to the voltage $V_S$ in a similar fashion as discussed in relation to FIG. 4a. It will be clear from the discussion in relation to FIG. 4a that the maximum voltage across the first transistor 301, and the maximum drain-source voltage, will thus occur when the driving signal $V_D$ (or the signal derived therefrom at node N1) is most positive. For the example voltages discussed above, the maximum source-drain voltage would thus be at most of the order of 10V, which is within the tolerance of a 12V LDMOS. As also discussed above there may be no substantially gate-source stress for either of the first or second transistors 301 or 302 and the gate of the third transistor can be driven to a level $V_{3ON}$ that turns the transistor on but which is within the accepted tolerance, e.g. a voltage of −2V for example.

For the gain switch however, when the relevant gain switch is in the off-state, the input to the output driver 105 will be tapped from another part of the resistor network and thus the voltage at node N2 will also exhibit a signal component that depends on the relevant component voltage $V_P$ output from the DAC 104.

In the example of FIG. 1, the DAC 104 provides a differential output and, in some embodiments, each of the component signals $V_P$ and $V_N$ may be a signal of a single polarity, with the components varying in antiphase. In other words, the component $V_P$ could vary within a positive range of say substantially zero to +V1 whilst the component $V_N$ could exhibit an equal-but-opposite variation within the same range, so that the differential signal varies from +V1 to zero.

The voltage at node N2 may thus also be a signal that varies, but the variation in the voltage at node N2 may be over a much more limited range and may be limited to a variation of a single polarity only. Purely to give an example for ease of explanation, the voltage at the node N2 could vary within a range of say substantially 0V to say around 1.5V.

In this case the voltage across the second transistor 302 may also vary when in the off state and may be at a maximum when the relevant input to the amplifier 105 is at a peak positive value, but in the example given the maximum voltage stress is of the order of 6.5V which is again well within the tolerance of a 12V LDMOS/EDMOS device for example.

In the on-state, illustrated in FIG. 5b, the switch arrangement 300 will be coupled as part of the signal path for the signal component $V_P$ and thus both nodes N1 and N2 may vary within the expected range for the input to the amplifier 105. In the example discussed above this may be in the range of say 0 to 1.5V as discussed above. If the gate voltage $V_{12ON}$ of the first and second transistors 301 and 302 were set to say, +2.5V, the gate-source voltage would be sufficient to maintain these transistors in the on state.

It will be understood that if the switch arrangement 300 is used as a gain switch, the first and second transistors 301 and 302 will, in the on-state, provide part of the signal path for the signal from the DAC 104 to the output driver 105. These transistors should thus be sized appropriately for a desired performance, e.g. a desired on-resistance. The third transistor 303 does not itself form part of the signal path for the audio signal and, as mentioned, is operated so as to regulate the voltage at the intermediate node N3 when the switch arrangement is disabled or in the off state. The third transistor 303 may therefore be implemented as a relatively small device.

Figure 6:
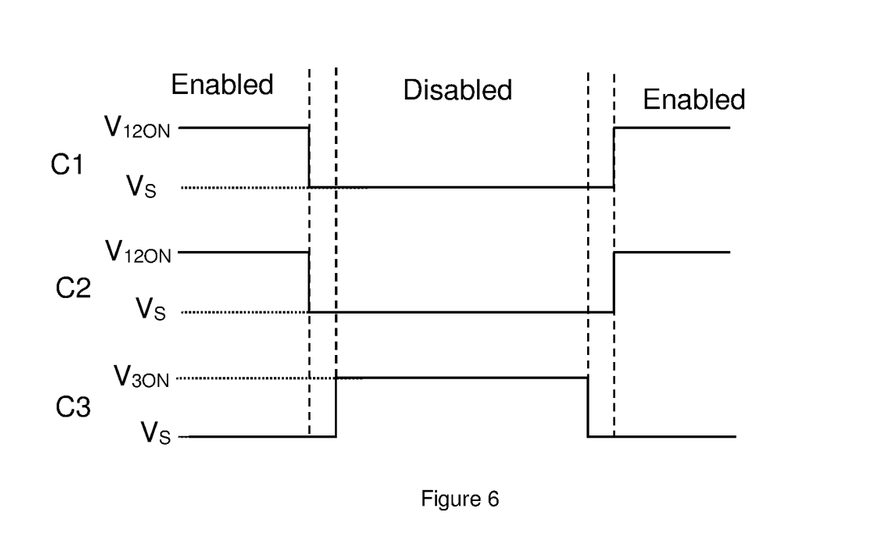
FIG. 6 illustrates one example of timing control of the gate signals for the switch arrangement of FIG. 3.

As discussed above, when the switch arrangement 300 is enabled, i.e. in an on-state, the first and second transistors 301 and 302 are both on and the third transistor is off. When the switch arrangement 300 is disabled, i.e. in an off-state, the first and second transistors 301 and 302 are both off and the third transistor is on. In a switch transition, i.e. from the enabled state to the disabled state or vice versa, the first and second transistors 301 and 302 may be switched simultaneously. In some embodiments it may be beneficial, in a transition to the disabled state, to ensure that the third transistor 303 is turned-on slightly before the first and second transistors are turned off to ensure that the voltage at the intermediate node N3 is correctly regulated and to avoid any voltage stress. Likewise, in a transition to the enabled state, it may be advantageous to keep the third transistor 303 turned-on until slightly after the first and second transistors are turned on. The switch controller 304 may therefore be arranged to implement such timed control of the relevant gate control signals. FIG. 6 illustrates one example of the gate control signals C1, C2, C3 over time for the first, second and third transistors 301, 302 and 303 respectively illustrating a transition from the switch enabled state to the disabled state and back to the enabled state.

Figure 7:
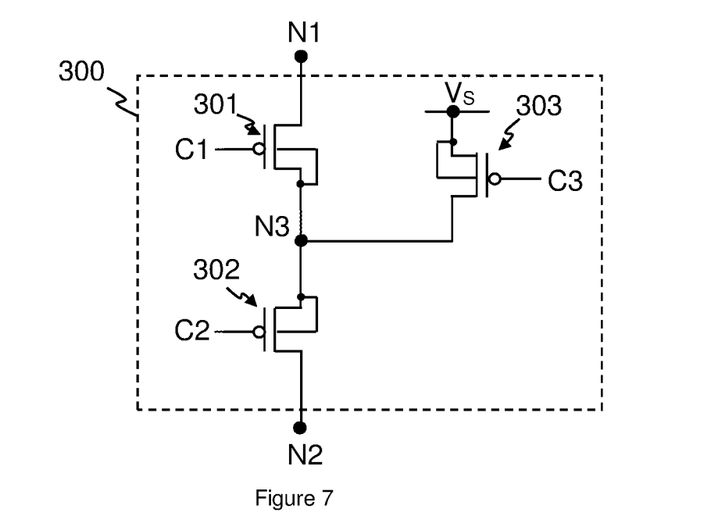
FIG. 7 illustrates a switch arrangement according to another embodiment.

The discussion above has focussed on the use of n-type transistors for the first, second and third transistors 301, 302 and 303. Such a switch arrangement, as illustrated in FIG. 3b, may be useful employed as the clamp switch $S_{CL}$ and/or as at least some of the gain switches as discussed with reference to FIG. 1. In some instances however the switch arrangement could be implemented with p-type devices. FIG. 7 illustrates an example of a switch arrangement with the first, second and third transistors 301, 302 and 303 implemented as PMOS devices. In this instance the defined voltage $V_S$ may be a positive voltage, which may be at least as positive as the maximum expected voltage at the nodes N1/N2.

In general embodiments of the present disclosure relate to a switch arrangement for switchable connecting first and second nodes of an audio driving circuit. The switch arrangement may be used to provide a switchable connection between first and second nodes of the audio driving circuit where at least one of the nodes will, in use, with the switch arrangement disabled, experience a signal swing that depends on the audio driving signal. The switch arrangements comprises first and second transistors in series between the first and second nodes. At least one, and possibly both, of the first and second transistors may have a gate-source voltage tolerance that is lower than expected peak-to-peak range of the signal swing. Additionally or alternatively, at least one, and possibly both, of the first and second transistors may have a gate-source voltage tolerance that is lower than expected maximum voltage difference between the first and second nodes in use.

The switch arrangement according to embodiments of the disclosure makes use of just three transistors and can be implemented by a relatively small circuit area. This avoids the use of a switch arrangements that require a high number of transistors, which would be undesirable in terms of circuit area and cost and also possibly power. As noted the voltage tolerance for the gate of the transistors may be lower than an expected voltage difference across the switch arrangement in use and/or a peak-to-peak voltage swing for at least one of the switch terminals. This means that transistors can be implemented using semiconductor fabrication processes that are suitable for relatively low voltage circuits as would typically be used for audio driving circuitry. This avoids the need to fabricate the circuit using processes that are suitable for high voltages which could add to the cost and complexity of fabrication.

It should be noted that the example voltages described above are given purely as examples for ease of explanation. Other voltages may be applicable for other applications and for different semiconductor fabrication processes. For example, as discussed above one known process may provide a gate oxide with a voltage tolerance of the order of 3V or so. Other processes, e.g. smaller process node geometries, may typically result in a different, e.g. lower, voltage tolerance. The switch arrangements of the present disclosure could be implemented to provide switching arrangements that can cope with larger signals swings whilst keeping the gate-source voltage within tolerance.

The switch arrangements are particular suitable for audio driving circuitry but the general structure of the switch arrangement represents a novel aspect of the disclosure and may be implemented in other applications.

Note that as used herein the term audio is not restricted to frequencies within the audible frequency range and the term audio should be read as including other frequencies such as ultrasonic frequencies and/or driving signals such as haptic driving signals for haptic transducers such as linear resonant actuators or the like.

Embodiments may be implemented as an integrated circuit which in some examples could be a codec or similar. Embodiments may be incorporated in an electronic device, which may for example be a portable device and/or a device operable with battery power. The device could be a communication device such as a mobile telephone or smartphone or similar. The device could be a computing device such as notebook, laptop or tablet computing device. The device could be a wearable device such as a smartwatch. The device could be a device with voice control or activation functionality.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)

programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope

The invention claimed is:

1. Audio driving circuitry comprising:
    at least one switch arrangement, the or each switch arrangement being connected between respective first and second nodes of the audio driving circuitry for switchably connecting the first and second nodes and comprising:
        first and second transistors of the same polarity type connected in series between the first and second nodes; and
        a third transistor connected between a defined voltage and an intermediate node between the first and second transistors; wherein:
        the first transistor has a drain connection to the first node and a source connection to the intermediate node;
        the second transistor has a drain connection to the second node and a source connection to the intermediate node; and
        the third transistor has a source connection to the defined voltage and a drain connection to the intermediate node;
    wherein a gate voltage tolerance for at least one of the first transistor and the second transistor is lower than an expected peak-to-peak voltage swing at said first node in use.

2. Audio driving circuitry as claimed in claim 1 wherein at least one of the first, second and third transistors comprises a laterally diffused MOS transistor.

3. Audio driving circuitry as claimed in claim 1 wherein at least one of the first, second and third transistors comprises an extended drain MOS transistor.

4. Audio driving circuitry as claimed in claim 1 wherein the first, second and third transistors each comprises n-type transistors.

5. Audio driving circuitry as claimed in claim 4 wherein the defined voltage is at least as negative as an expected most negative signal value at the first node.

6. Audio driving circuitry as claimed in claim 1 wherein the first, second and third transistors each comprises p-type transistors.

7. Audio driving circuitry as claimed in claim 1 wherein a gate voltage tolerance for at least one of the first transistor and the second transistor is lower than an expected maximum voltage difference between the first and second nodes in use.

8. Audio driving circuitry as claimed in claim 1 comprising a switch controller configured to control said switch arrangement in one of:
    an enabled state with the first and second transistors turned-on and the third transistor turned off; and
    a disabled state with the first and second transistors turned-off and the third transistor turned on.

9. Audio driving circuitry as claimed in claim 8 wherein the switch controller is configured to turn the first and second transistors off before turning the third transistor on when transitioning from the enabled state to the disabled state.

10. Audio driving circuitry as claimed in claim 8 wherein the switch controller is configured to turn the third transistor off before turning the first and second transistors when transitioning from the disabled state to the enabled state.

11. Audio driving circuitry as claimed in claim 1 comprising an output driver for outputting an audio driving signal to an output path.

12. Audio driving circuitry as claimed in claim 11 wherein one of said at least one switch arrangements is configured as a clamp switch with the respective first node coupled to the audio output path for the audio driving signal and the respective second node coupled to a defined reference voltage.

13. Audio driving circuitry as claimed in claim 11 wherein one of said at least one switch arrangements is configured as a gain switch for varying a gain of the output driver.

14. Audio driving circuitry as claimed in claim 13 wherein, for the switch arrangement configured as a gain switch, the respective first node is coupled to a resistor network and the respective second node is coupled to an input path for the output driver.

15. Audio driving circuitry as claimed in claim 1 implemented as an integrated circuit.

16. Audio driving circuitry as claimed in claim 1 wherein the audio driving circuitry forms at least part of an audio codec.

17. An electronic device comprising audio driving circuitry as claimed in claim 1 and a connector for making a removable mating connection with an accessory apparatus in use, wherein said audio driving circuitry is configured to output at least one audio driving signal to an electrical contact of said connector.

18. Audio driving circuitry comprising:
    a switch arrangement connected between first and second nodes of the audio driving circuitry for switchably connecting the first and second nodes and comprising:
        a first transistor with a drain connection to the first node and a source connection to an intermediate node;
        a second transistor with a drain connection to the second node and a source connection the intermediate node;
        a third transistor with a source connection to a defined voltage and a drain connection to the intermediate node;
    wherein at least one of the first and second transistors has a gate voltage tolerance which is lower than an expected voltage swing at the first node.

* * * * *